United States Patent
Bachrach et al.

(10) Patent No.: US 6,818,529 B2
(45) Date of Patent: Nov. 16, 2004

(54) APPARATUS AND METHOD FOR FORMING A SILICON FILM ACROSS THE SURFACE OF A GLASS SUBSTRATE

(75) Inventors: Robert Bachrach, Burlingame, CA (US); Kam Law, Union City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 90 days.

(21) Appl. No.: 10/243,242

(22) Filed: Sep. 12, 2002

(65) Prior Publication Data

US 2004/0056332 A1 Mar. 25, 2004

(51) Int. Cl.[7] .......................... H01L 21/30; H01L 21/46
(52) U.S. Cl. ........................ 438/455; 438/464; 438/479; 438/480; 438/528; 438/977
(58) Field of Search ................................ 438/455, 459, 438/460, 464, 479, 480, 514, 528, 795, 928; 4387/977

(56) References Cited

U.S. PATENT DOCUMENTS

| | | | |
|---|---|---|---|
| 5,493,986 A | | 2/1996 | Augusto |
| 6,010,579 A | * | 1/2000 | Henley et al. ............. 148/33.2 |
| 6,146,979 A | * | 11/2000 | Henley et al. ............. 438/458 |
| 6,159,825 A | * | 12/2000 | Henley et al. ............. 438/460 |
| 6,335,264 B1 | * | 1/2002 | Henley et al. ............. 438/460 |
| 2002/0008298 A1 | | 1/2002 | Akram |
| 2002/0070454 A1 | | 6/2002 | Yasukawa |

OTHER PUBLICATIONS

International Search Report PCT/US03/28581.

* cited by examiner

Primary Examiner—Evan Pert
Assistant Examiner—Asok Kumar Sarkar
(74) Attorney, Agent, or Firm—Blakely, Sokoloff, Taylor & Zafman

(57) ABSTRACT

A silicon on insulator substrate apparatus for fabricating an active-matrix liquid crystal display is described herein. The silicon on insulator substrate may include a handle substrate and a plurality of crystalline silicon donor portions bonded to the handle substrate. The crystalline silicon donor portions may be bonded to the handle substrate by providing a plurality of donor substrates and forming a separation layer within each donor substrate. The donor substrates may be arranged across a surface of the handle substrate and subsequently bonded to the handle substrate. The donor substrates may then be cleaved at their respective separation layers and removed from the handle substrate, thereby leaving a donor portion of each donor substrate attached the handle substrate.

13 Claims, 16 Drawing Sheets

| Resolution | Pitch | Size | | diagonal | | Ratio |
|---|---|---|---|---|---|---|
| | 0.28 mm | mm | mm | mm | inches | |
| VGA | 640 | 480 | 179.2 | 134.4 | 224.00 | 8.82 | 1.33 |
| SVGA | 800 | 600 | 224.0 | 168.0 | 280.00 | 11.02 | 1.33 |
| XGA | 1024 | 780 | 286.7 | 218.4 | 360.43 | 14.19 | 1.31 |
| WS | 1280 | 1024 | 358.4 | 286.7 | 458.98 | 18.07 | 1.25 |
| | 0.30 mm | mm | mm | mm | inches | |
| VGA | 640 | 480 | 192.0 | 144.0 | 240.00 | 9.45 | 1.33 |
| SVGA | 800 | 600 | 240.0 | 180.0 | 300.00 | 11.81 | 1.33 |
| XGA | 1024 | 780 | 307.2 | 234.0 | 386.17 | 15.20 | 1.31 |
| WS | 1280 | 1024 | 384.0 | 307.2 | 491.76 | 19.36 | 1.25 |
| | 0.33 mm | mm | mm | mm | inches | |
| VGA | 640 | 480 | 211.2 | 158.4 | 264.00 | 10.39 | 1.33 |
| SVGA | 800 | 600 | 264.0 | 198.0 | 330.00 | 12.99 | 1.33 |
| XGA | 1024 | 780 | 337.9 | 257.4 | 424.79 | 16.72 | 1.31 |
| WS | 1280 | 1024 | 422.4 | 337.9 | 540.94 | 21.30 | 1.25 |

FIG. 1

APPARATUS AND METHOD FOR FORMING A SILICON FILM ACROSS THE SURFACE OF A GLASS SUBSTRATE

FIELD OF THE INVENTION

This invention relates generally to the manufacture of large active-matrix liquid crystal displays, and more specifically to a method and apparatus for forming a silicon film across the surface of a glass substrate.

BACKGROUND OF THE INVENTION

Many common electronic devices utilize liquid crystal displays (LCDs) to display images or characters. LCDs have become increasingly popular because they offer several advantages over other display technologies. For example, LCDs are typically thinner, lighter, and consume much less power than cathode ray tube (CRT) monitors. Additionally, LCDs do not suffer from convergence issues, and images may be displayed at low refresh rates without suffering image flicker problems.

Common-plane-based LCDs are generally used in simple displays that repeatedly show the same images. For example, common-plane-based LCDs are commonly used as digital watch and microwave timer displays. Computers, televisions, and other such devices requiring complex display capabilities generally utilize either passive matrix or active matrix LCDs.

Passive-matrix LCDs employ a simple grid to supply a charge to a particular pixel on the display. The grid is typically formed by applying a transparent conductive material, such as indium-tin oxide, to two glass substrates. On one substrate, the transparent conductive material is formed in columns; on the other substrate, the transparent conductive material is formed in rows. The rows and columns are connected to integrated circuits that control when a charge is sent down a particular column or row. A liquid crystal material is sandwiched between the two glass substrates, and a polarizing film is added to the outer side of each substrate. To turn on a pixel, an integrated circuit sends a charge down the correct column of one substrate and a ground activated on the correct row of the other substrate. The row and column intersect at the designated pixel, and the voltage field across the intersection area causes the liquid crystals at that pixel to untwist.

Passive-matrix LCDs may have significant drawbacks. For example, the response time, or the ability of the LCD to refresh a displayed image, is typically slow. As a result, rapidly changing screen content, such as video or fast mouse movements, may cause "smearing" because the display cannot keep up with image content changes. Additionally, voltage control may be imprecise, hindering a passive matrix LCD's ability to control individual pixels without affecting adjacent pixels. For example, voltage applied to untwist one pixel may cause surrounding pixels to partially untwist, resulting in fuzzy images, poor contrast, and ghosting of off pixels in the same rows and columns. Moreover, increased screen-size and pixel counts negatively affect display parameters due to large capacitance and limited conductivity of the electrodes.

In an active-matrix LCD, pixel addressing take place behind the liquid crystal film. The rear surface of the front substrate is coated with a continuous transparent electrode while the rear surface is patterned into individual pixels. Thin film transistors (TFTs), comprising tiny switching transistors and capacitors, are used to apply a voltage to a particular pixel on the display. The TFTs are typically formed in a matrix on a quartz or glass substrate. To address a particular pixel, the proper row is switched on and a charge is sent down the correct column. Because all of the other rows that the column intersects are turned off, only the capacitor at the designated pixel receives a charge, and the capacitor is structured to hold the charge until the next refresh cycle. As a result, the use of TFTs eliminates the problems of slow response speed and ghosting that afflicts passive-matrix LCDs. Additionally, active-matrix LCDs may be used to create a greater range of gray scale by controlling the amount of voltage supplied to a particular pixel in additional increments. For example, active-matrix LCDs can offer 256 or more levels of brightness per pixel. Due to enhanced performance benefits, active-matrix LCDs are currently used in almost all portable electronic device applications with diagonal screen sizes from about 2–15 inches.

Each pixel within a color active-matrix LCD is formed from three sub-pixels with red, green, and blue color filters. Each sub-pixel is connected to a TFT that controls the degree of liquid crystal action at that sub-pixel. As a result, the intensity of the red, green, and blue elements of each pixel forming an image on the LCD may each be independently adjusted by controlling the amount of voltage applied to each sub-pixel. For example, by controlling the TFT voltage output to each sub-pixel, the intensity of each sub-pixel may be varied to produce over 256 shades. Combining the sub-pixels produces a possible palette of approximately 16.8 million colors. Such displays require a large number of TFTs. For example, a typical laptop computer with an active-matrix color LCD supporting resolutions up to 1,024×768 requires 2,359,296 TFTs.

In the past, TFTs have typically been formed from amorphous silicon (a-Si) deposited by plasma enhanced chemical vapor deposition (PE-CVD) processes. The advantage of using amorphous silicon is that it may be formed at lower process temperatures on relatively inexpensive glass substrates. However, amorphous silicon TFTs suffer from numerous known limitations.

For example, high electron mobility is a critical factor in increasing LCD performance. However, the limited electron mobility inherent to amorphous silicon TFTs provides for limited frame refresh rates and pixel densities. Higher amorphous silicon TFT performance may be achieved using powerful driver circuitry, but the resulting high energy consumption is detrimental to portable electronic device functionality.

One of the largest cost elements in an active-matrix LCD is the external driver circuitry. In a typical active-matrix display utilizing amorphous silicon TFTs, each pixel is independently connected to discrete logic chip drivers arranged on printed circuit boards (PCBs) around the periphery of the display area. As a result, a large number of external connections are required from the LCD panel to the PCBs, resulting in high manufacturing costs. The arrangement of PCBs around the periphery of the display area also limits the form factor of the casing surrounding the LCD.

The brightness of an LCD is determined in part by the aperture ratio of the pixels, or the ratio of light passing through each pixel to the entire area of the pixel and associated electronics. A larger aperture ratio allows more light to pass through the pixel, resulting in a brighter image on the LCD. Typical amorphous-silicon active-matrix LCDs have a pitch of approximately 0.3 mm with a corresponding color sub-pixel size of 0.1 mm or 100 microns. The TFTs and wire connections on these displays typically occupy corridors approximately 10 microns wide. Additionally, the properties of amorphous-silicon TFTs change when the material is exposed to heat and light, and amorphous-silicon TFTs must be shielded from ambient light to prevent instabilities, resulting in a reduced aperture ratio. Consequently, active-matrix displays utilizing amorphous silicon TFTs often require more powerful backlighting, resulting in increased energy consumption.

Crystalline forms of silicon, such as poly-silicon (p-Si) and mono-crystalline silicon, have higher electron mobilities than amorphous silicon. As a result, increased frame refresh rates, higher pixel densities, and larger aperture ratios may be achieved with TFTs formed from crystalline silicon materials. Additionally, the use of crystalline silicon TFTs may allow the driver circuitry and peripheral electronics to be made an integral part of the LCD itself, thereby reducing the number of components required to manufacture an individual display and allowing larger LCDs to be fitted into existing casing designs.

At the present time, poly-silicon TFTs have been developed for use in small active-matrix projection LCDs. Poly-silicon may be directly deposited by a chemical vapor deposition (CVD) process at temperatures greater than 590° C. Due to the high process temperatures, poly-silicon deposition typically requires the use of expensive quartz substrates. Metal induced crystallization is able to overcome some of these problems, resulting in a lower process temperature of approximately 450° C.

Small projection LCDs utilizing poly-silicon TFTs formed on quartz substrates may be manufactured economically due to their small size, typically less than two inches diagonally. However, the cost of quartz substrates increases exponentially with size, and the use of one-piece quartz substrates to manufacture larger, direct-view LCDs is prohibitively expensive.

Currently, some manufacturers are attempting to form poly-silicon on large conventional glass substrates by means of thermal conversion of amorphous silicon using Excimer lasers. Using this process, n-type mobilities of 10–500 have been achieved, equaling those of crystalline silicon devices. However, it is unlikely the Excimer laser thermal conversion process can adequately enhance p-type poly-silicon mobilities. As a result, this process fails to achieve the necessary p-type mobilities required for CMOS devices, such as SRAM components in the LCD external driver circuitry.

Other manufacturers have developed processes whereby two or more active-matrix LCDs are joined together to form a "tiled" display device. Several different approaches have been applied to this methodology. In one approach, seams between individual display tiles are deliberately made visible and displayed images are extended continuously over the tiles and seams. This approach is used by Clarity and Pioneer, among others, in their stackable video-wall display products. In another approach, seams between individual display tiles are hidden such that they are completely invisible to the naked eye under normal viewing conditions. Rainbow Displays Incorporated located in Endicott, N.Y. has developed a process by which two or more active-matrix LCDs with pixel pitches less than 1 mm may be "seamlessly" joined to form a single tiled display device. However, seamless tiled displays face significant manufacturing challenges. For example, it is extremely difficult to maintain continuous pixel pitch across seams and tile alignment must be extremely precise to meet visual acuity standards. Furthermore, uniform tile luminance and chromaticity must be maintained across seams. As a result, seamless tiled displays typically require sophisticated light management and digital signal processing techniques.

Consequently, a need exists for a low-temperature process of forming crystalline silicon, such as poly-silicon and mono-crystalline silicon, on conventional glass substrates.

DESCRIPTION OF THE DRAWINGS

The present invention is illustrated by way of example, and not by way of limitation, in the figures of the accompanying drawings.

FIG. 1 is a table depicting several standard resolution display sizes for a variety of pixel pitches.

SUMMARY OF THE INVENTION

A silicon on insulator substrate apparatus for fabricating an active-matrix liquid crystal display is described herein. The silicon on insulator substrate may include a handle substrate and a plurality of crystalline silicon donor portions bonded to the handle substrate. The crystalline silicon donor portions may be bonded to the handle substrate by providing a plurality of donor substrates and forming a separation layer within each donor substrate. The donor substrates may be arranged across a surface of the handle substrate and subsequently bonded to the handle substrate. The donor substrates may then be cleaved at their respective separation layers and removed from the handle substrate, thereby leaving a donor portion of each donor substrate attached the handle substrate.

DETAILED DESCRIPTION OF THE INVENTION

In the following description, numerous specific details are set forth, such as specific materials, machines, and methods, in order to provide a thorough understanding of the present invention. However, one skilled in the art will appreciate that these specific details are not necessary in order to practice the present invention. In other instances, well known equipment features and processes have not been set forth in detail in order to not unnecessarily obscure the present invention.

According to the present invention, a requisite number of silicon donor substrates may be prepared with a separation layer. The donor substrates may be positioned in an aligned array across the surface of a handle substrate and bonded to the handle substrate by means of a low temperature bonding process. The donor substrates may then be removed from the handle substrate, leaving a donor portion of each donor substrate attached to the handle substrate. A filler material may be deposited on the handle substrate in the gaps between adjacent donor portions. The surface of the handle substrate may subsequently be planarized, annealed, and subjected to additional processing.

The present invention may be used to bond a plurality of mono-crystalline silicon or poly-silicon substrate "tiles" to a glass substrate, thereby forming a crystalline silicon film across a surface of the glass substrate. Thin film transistors (TFTs) may be subsequently formed on the silicon film for use in large area electronic applications, such as active-matrix liquid crystal displays.

Silicon Donor Process

In order to form a silicon on insulator (SOI) substrate in accordance with an embodiment of the present invention, a handle substrate and a plurality of silicon donor substrates are provided. A donor substrates is a substrate which provides a donor portion of silicon to be transferred. A handle substrate is a substrate typically comprising a non-conductive material that receives transferred silicon donor portions from donor substrates. Subsequent to the transfer process, the handle substrate becomes a silicon on insulator substrate.

Figure 13:
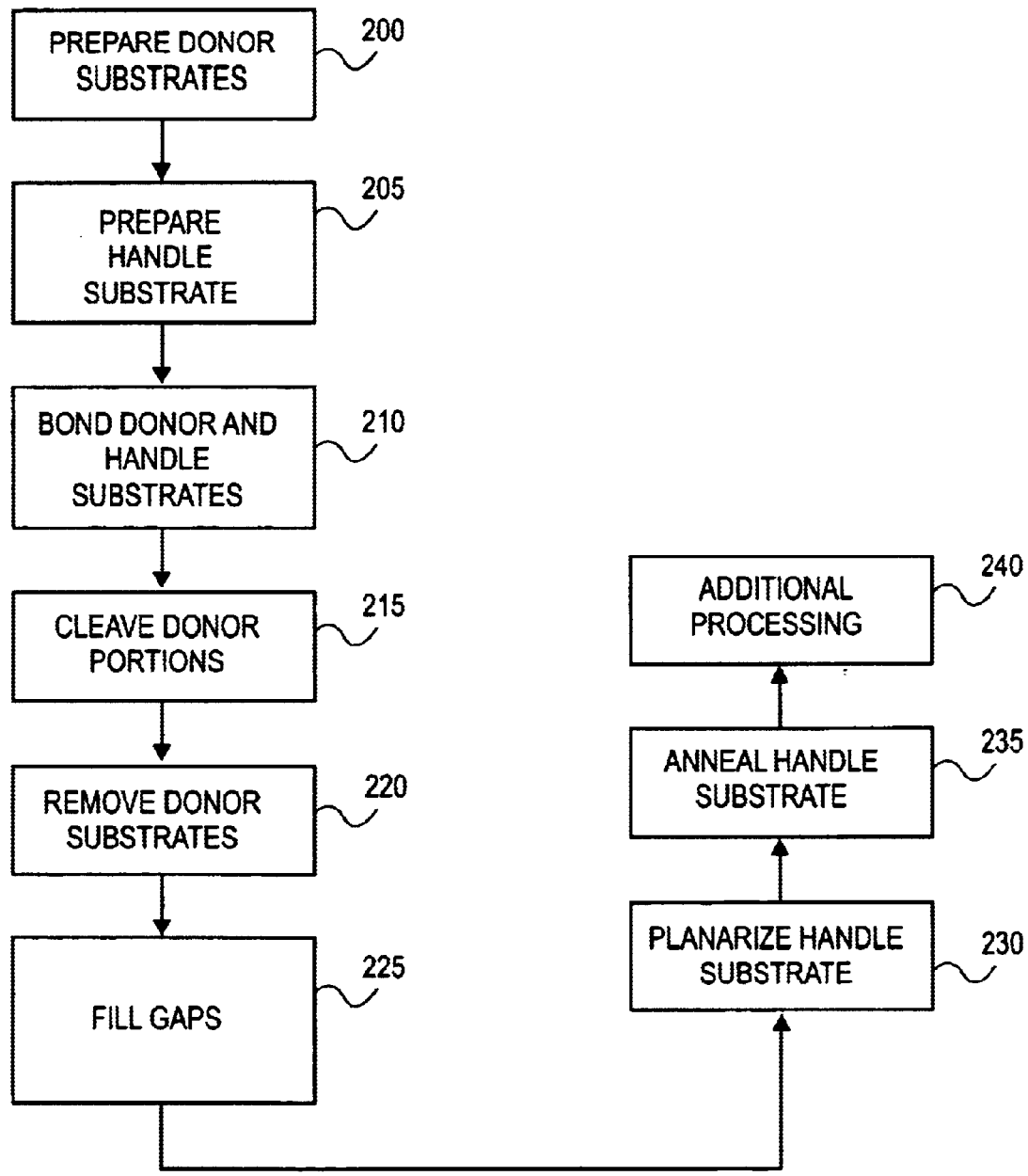
FIG. 13 is a block diagram illustrating a process flow for fabricating a poly-silicon on glass substrate.

FIG. 13 shows an example process flow for forming a silicon on insulator substrate in accordance with an embodiment of the present invention. At step 200, a requisite number of silicon donor substrates may be prepared with a separation layer. At step 205, a handle substrate may be prepared with a barrier layer, an optional accommodation layer, and a bonding layer. At step 210, the silicon donor substrates prepared at step 200 may be arranged across the handle substrate prepared in step 205, and the silicon donor substrates and the handle substrate may be bonded together. At step 215, the donor substrates bonded to the handle substrate at step 210 may be cleaved at the separation layer formed at step 200. At step 220, portions of the donor substrates cleaved at step 215 may be removed from the handle substrate, leaving donor portions of the donor substrates bonded to the handle substrate. At step 225, gaps between adjacent donor portions on the handle substrate surface may be filled with a deposited material, thereby forming a continuous donor portion layer across the surface of the handle substrate. At step 230, the donor portion layer may be planarized. At step 235, the handle substrate and donor portion layer may be annealed. At step 240, the handle substrate may be subjected to additional processing.

Donor Substrates

Figure 7:
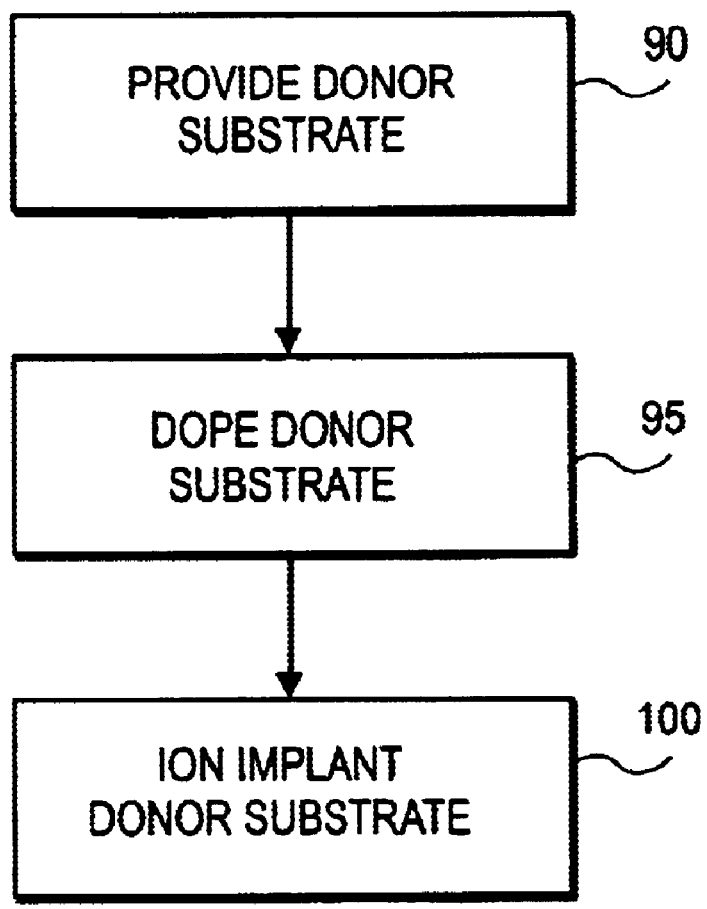
FIG. 7 is a block diagram illustrating a method of fabricating a donor substrate.

A donor substrate is a substrate which provides a donor portion of silicon to be transferred to a handle substrate. FIG. 7 shows an example process flow for forming a donor substrate. At step 90, a donor substrate is provided. At step 95, the donor substrate may be doped to a desired conductivity type and level. At step 100, the donor substrate may be subjected to an ion implant process to create a separation layer across the bulk of the donor substrate, thereby defining a donor portion of the donor substrate.

Modern integrated circuit manufacturing processes typically use 200 mm and 300 mm diameter mono-crystalline silicon wafer substrates. As a result, commercially available 200 mm and 300 mm diameter mono-crystalline silicon wafers may be used as cost effective donor substrates. Other commercially available standard diameter silicon substrates, such as 6, 5, and 4-inch diameter mono-crystalline silicon wafers, may also be used as cost effective donor substrates.

Figure 4:
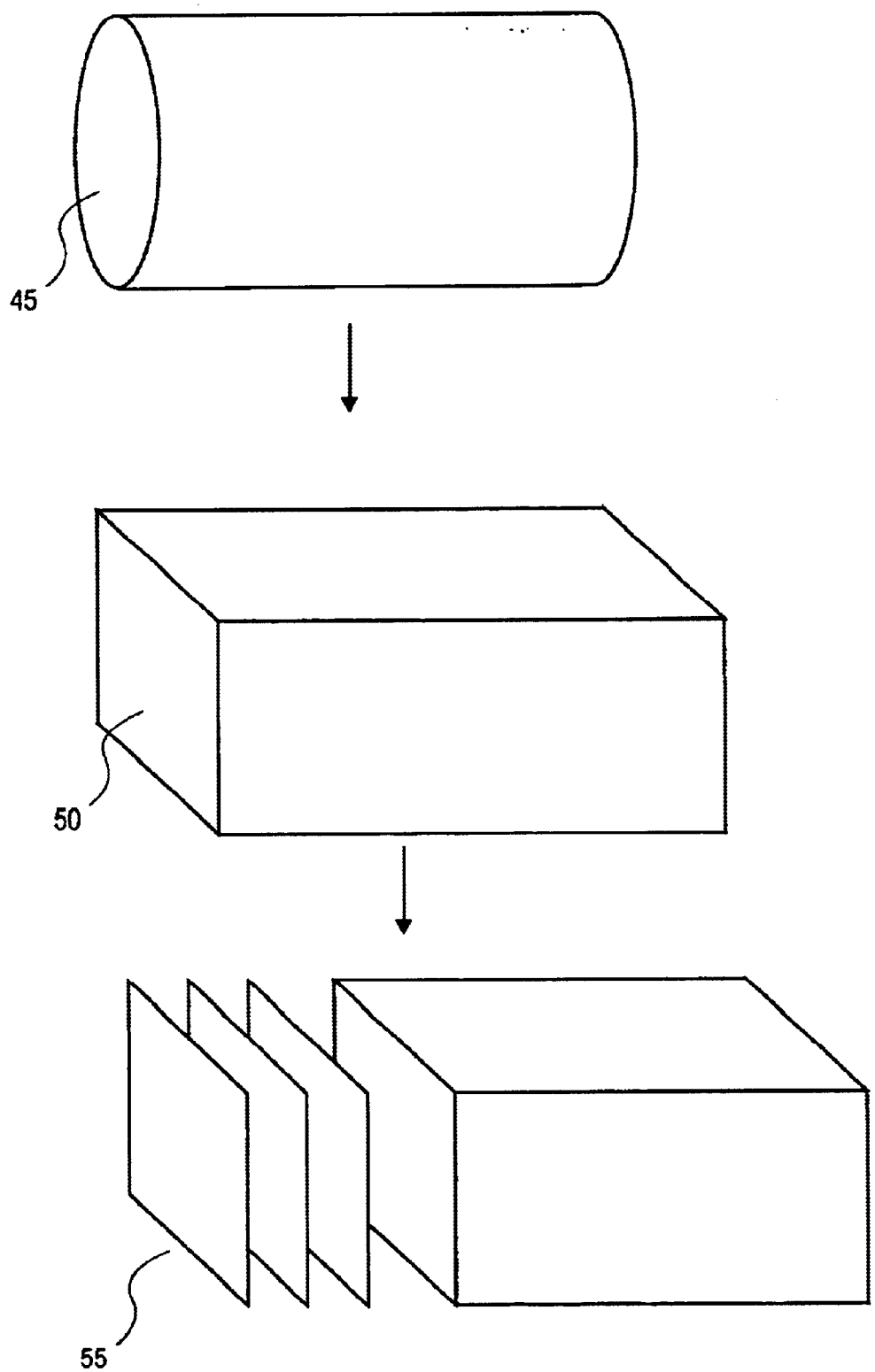
FIG. 4 is a schematic diagram illustrating a method of fabricating a donor substrate.

In alternative embodiments, mono-crystalline silicon donor substrates may be fabricated by modifying standard diameter mono-crystalline silicon boules or wafers. For example, referencing FIG. 4, silicon donor substrates 55 may be prepared from a standard diameter mono-crystalline wafer ingot 45 which is ground to a desired cross-sectional shape 50, such as square or rectangular, and then cross-sectioned.

Figure 5:
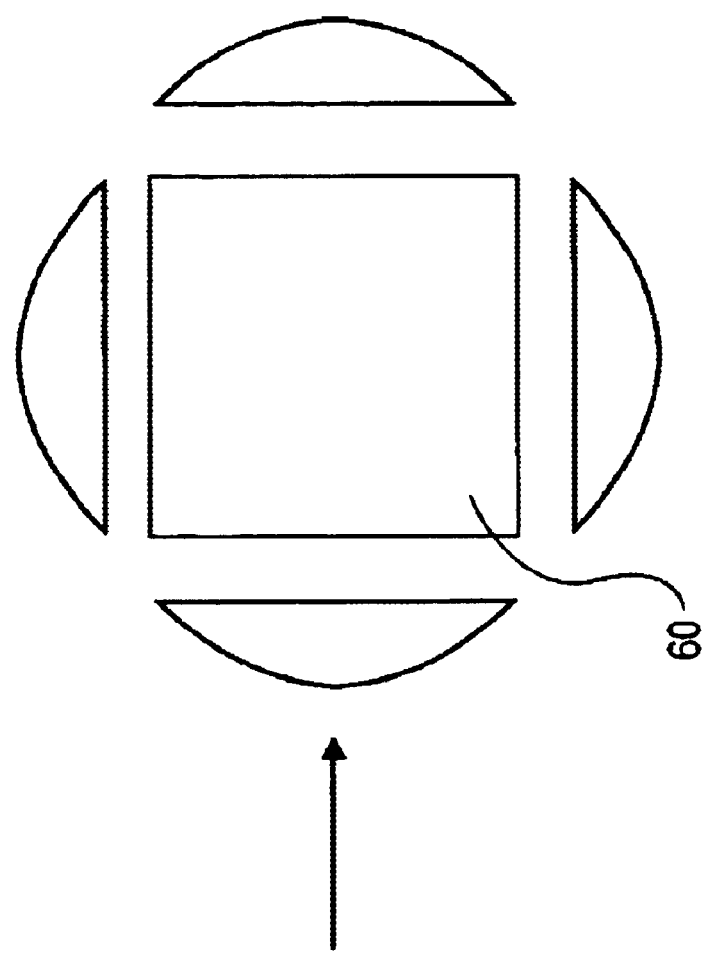
FIG. 5 is a schematic diagram illustrating a method of fabricating a donor substrate.
Figure 5:
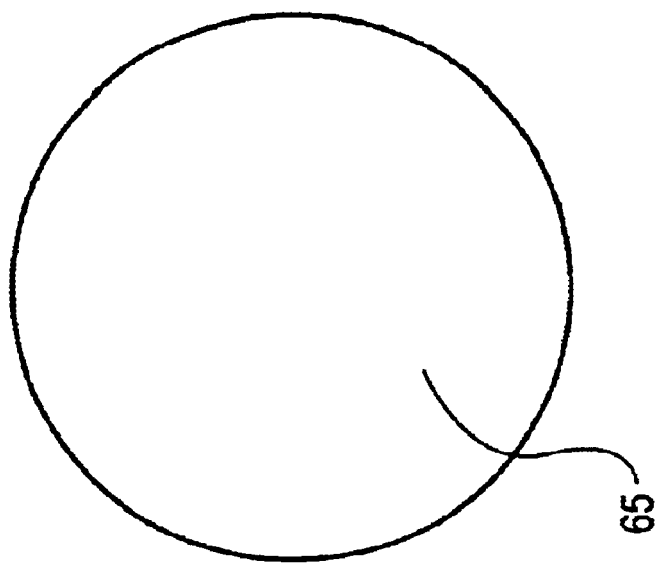

Alternatively, standard diameter mono-crystalline silicon wafers may be trimmed to a desired cross-sectional shape using standard wafer fabrication techniques. For example, referencing FIG. 5, a standard diameter mono-crystalline silicon substrate 65 may be trimmed to form square donor substrate 60 by means of a laser or diamond blade cutting process. Using these processes, 140 mm square donor substrates may be formed from 200 mm diameter mono-crystalline wafers or boules, and 210 mm square donor substrates may be formed from 300 mm diameter mono-crystalline wafers or boules. Smaller square donor substrates may be fabricated from 6, 5, and 4-inch diameter mono-crystalline silicon boules and wafers.

In other embodiments, donor substrates may be formed into other multi-sided geometric shapes, such as but not limited to triangles, pentagons, hexagons, and octagons. Furthermore, donor substrates may be doped to any desired conductivity type and level desired. In one embodiment, donor substrates may be undoped or doped with p-type and n-type impurities to a level between 1E16–1E18 atoms/cm$^3$.

Figure 6:
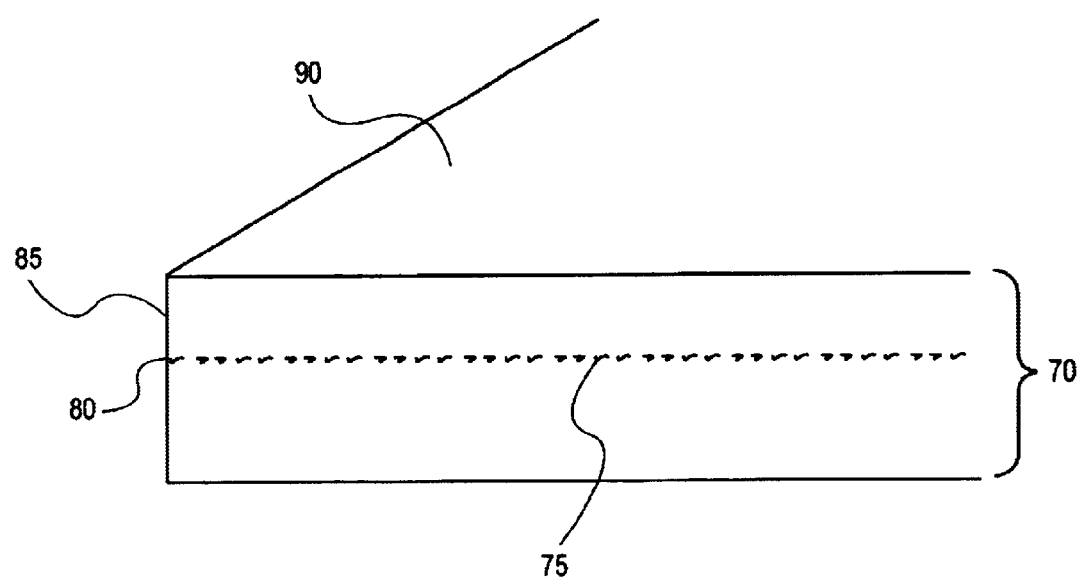
FIG. 6 is a cross-section of a donor substrate.

Referencing FIG. 6, each donor substrate 70 may be subjected to an ion implant process to create dislocations 75 within the substrate crystalline structure. Dislocations 75 may form a separation layer 80 across the bulk of each donor substrate, thereby defining a donor portion 85 of each substrate. Donor substrate 70 may be implanted, for example, with hydrogen atoms or with inert ions such as argon (Ar) or helium (He).

Hydrogen ion implantation generates an internal hydrogen rich layer at separation layer 80 within donor substrate 70. The depth of the ion implantation peak determines the thickness of donor portion 85 which will subsequently be removed from donor substrate 70. In one embodiment, hydrogen ions may be implanted at a depth of 50–500 nm into donor substrate 70 using a 10–30 KeV ion implantation process, corresponding to a donor portion 85 approximately 50–500 nm in thickness. In an alternative embodiment, a thin strained silicon-germanium (SiGe) layer may also be implanted at separation layer 80. The silicon-germanium layer may lower the fracture energy required for the controlled cleave process described below.

In one embodiment, donor substrate 70 may be ion implanted with a plasma immersion ion implantation process, thereby forming dislocations 75 and separation layer 80. In a plasma immersion ion implantation process, a high negative bias voltage is applied to each donor substrate 70 to accelerate ions toward the face of the donor substrate. A plasma immersion ion implantation process implants the entire surface of donor substrate 70. The P-III Ion Implantation System developed by Silicon Genesis Corporation located in Campbell, Calif. may be used for plasma immersion ion implantation. Additionally, ion implantation may be carried out using, for example, beam line ion implantation equipment manufactured by companies such as Applied Materials Incorporated, Eaton Corporation, Varian, and others.

In another embodiment, donor portion 85 may be deposited onto the surface of donor substrate 70. For example, donor portion 85 may comprise a poly-silicon layer deposited onto the surface of donor substrate 70 by means of an epitaxial deposition process. Consequently, additional poly-silicon may be continually added to donor substrate 70 after each donor portion transfer process, thereby enabling the regeneration of donor portion 85 on donor substrate 70 and allowing a much longer lifetime of donor substrate 70. Hence, the cost of donor portion 85 may be primarily dependent upon epitaxial deposition costs. Additionally, growing an epitaxial silicon donor portion 85 on donor substrate 70 allows for the precise control of n-type and p-type dopant density of silicon on donor substrates 70. In alternative embodiments, a silicon alloy such as silicon germanium may be grown on the surface of donor substrate 70.

Handle Substrate

Figure 3:
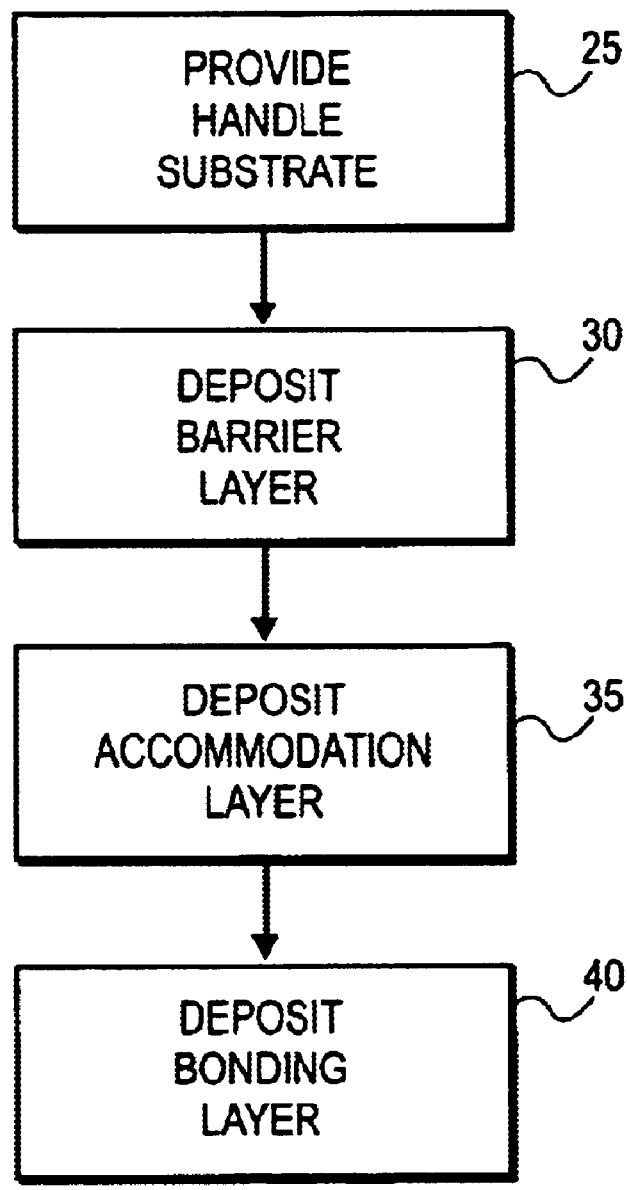
FIG. 3 is a block diagram illustrating a method of fabricating a handle substrate.

A handle substrate is a substrate typically comprising a non-conductive material that receives transferred silicon donor portions from donor substrates. FIG. 3 shows an exmple process flow for forming a barrier layer, an accommodation layer, and a bonding layer on a handle substrate. At step 25 a handle substrate is provided. At step 30, a barrier layer may be deposited onto the surface of the handle substrate. At step 35, an accommodation layer may be deposited onto the surface of the handle substrate on top of the barrier layer. At step 40, a bonding layer may be deposited onto the surface of the handle substrate on top of the accommodation layer. In some embodiments, the accommodation layer may not be present and the bonding layer may be formed directly above the barrier layer on the surface of the handle substrate.

Figure 2:
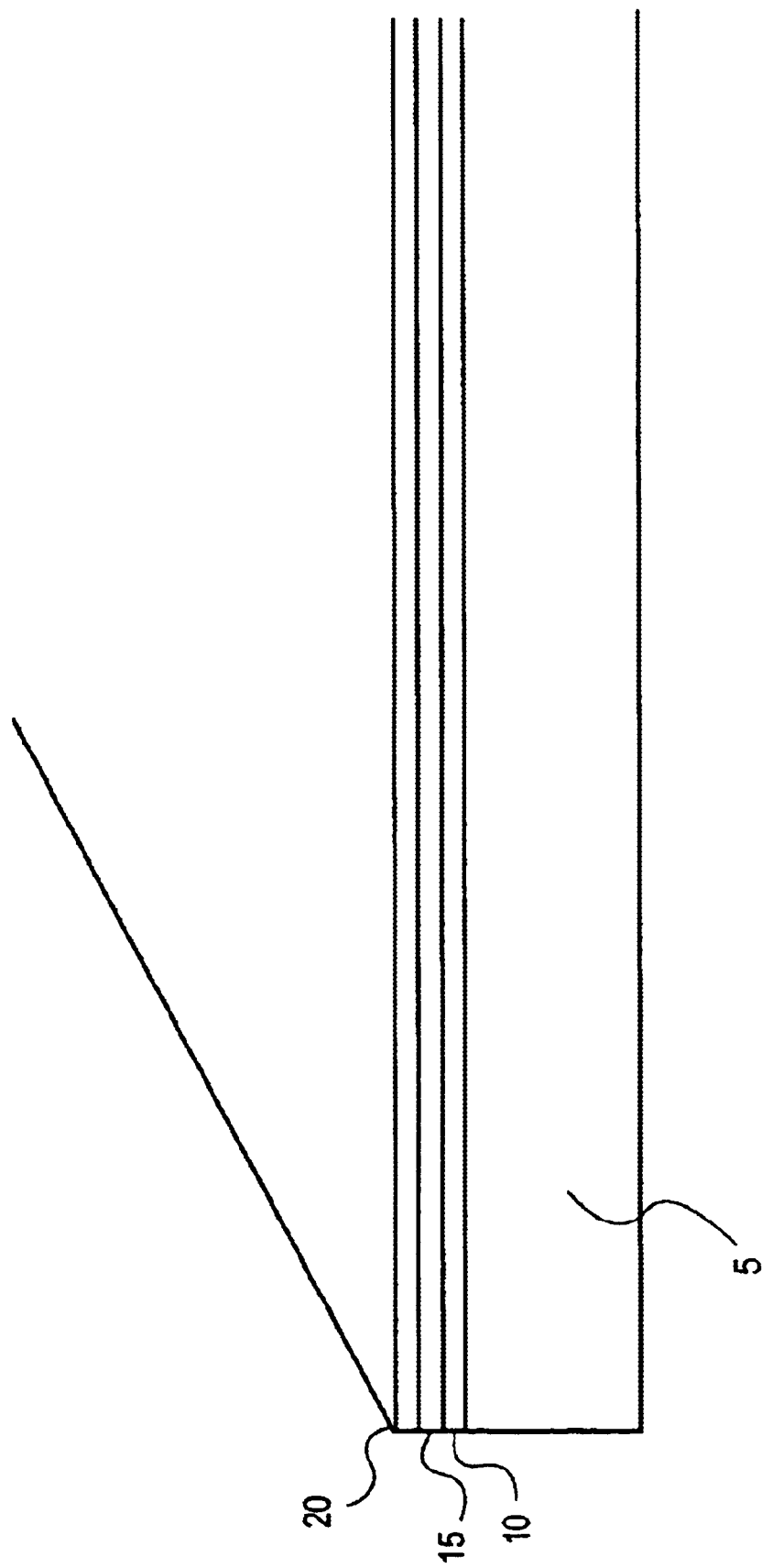
FIG. 2 is a cross-section of a handle substrate.

FIG. 2 shows a schematic cross-section of a handle substrate 5. A barrier layer 10 may be formed on the surface of handle substrate 5 to prevent the diffusion of impurities from handle substrate 5 into a transferred silicon donor portion. In one embodiment, barrier layer 10 may comprise a layer of silicon-nitride (SiN) approximately 500 nm in thickness. Barrier layer 10 may be formed on the surface of handle substrate 5 using commonly known deposition techniques, such as chemical vapor deposition (CVD) or physical vapor deposition (PVD).

A bonding layer 20 may be formed on barrier layer 10 to promote low temperature attachment of transferred donor portions from donor substrates. In one embodiment, bonding layer 20 may comprise a layer of silicon-oxide ($SiO_2$) approximately 100 nm in thickness. In an alternative embodiment, bonding layer 20 may comprise a layer of amorphous-silicon (a-Si). A number of other materials may be used as a bonding layer, such as various forms of silicon-dioxide. For example, FSG or USG. Bonding layer 20 may be formed on top of barrier layer 10 using commonly known deposition techniques. For example, an amorphous-silicon bonding layer may be formed using a plasma enhanced chemical vapor deposition (PE-CVD) process.

In an alternative embodiment, an accommodation layer 15 may be formed on top of barrier layer 10 prior to depositing bonding layer 20. Accommodation layer 15 may be used to reduce stresses between barrier layer 10 and bonding layer 20. Accommodation layer 15 may, for example, comprise a layer of a different type of oxide approximately 10–20 nm in thickness. A number of other materials may be used as a bonding layer, such as various forms of silicon-dioxide. Accommodation layer 15 may be formed on top of barrier layer 10 using commonly known deposition techniques. For example, an oxide accommodation layer may be formed using a deposition process.

In one embodiment, handle substrate 5 may comprise a glass substrate for fabricating a large active-matrix LCD. For example, handle substrate 5 may be formed from a material such as Corning 1737, Corning 2000F, or other similar materials as are used in the fabrication of large direct view liquid crystal displays. Handle substrate 5 is preferably formed from a material that is capable of withstanding process temperatures up to 600° C.

FIG. 1 illustrates a variety of VGA, SVGA, XGA, and WS resolution display sizes for 0.28 mm, 0.30 mm, and 0.33 mm pixel pitches. A pixel pitch of 0.33 is nominal for VGA displays, with a natural display size of 264 mm (10.4") diagonally. Consequently, a handle substrate for fabricating a VGA display with a 0.33 pixel pitch would measure at least 211.2 mm×158.4 mm. This example is merely illustrative and the present invention may be readily adapted to accommodate a wide range of handle substrate geometries.

Donor Substrate to Handle Substrate Bonding and Cleaving Process

Figure 10:
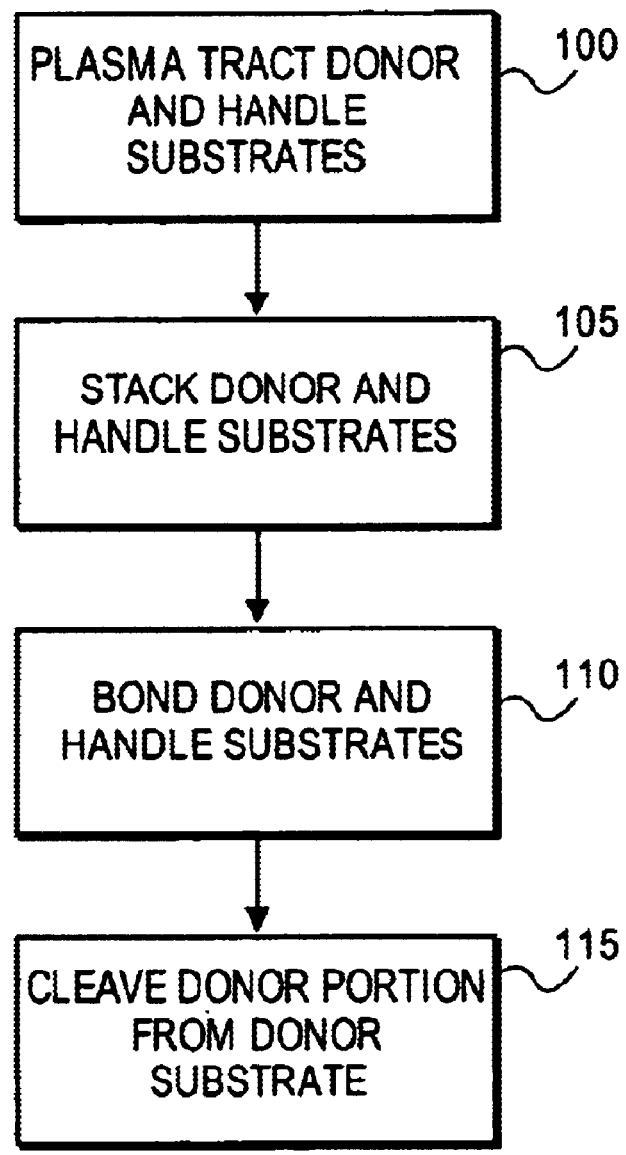
FIG. 10 is a block diagram illustrating a bonding and controlled cleaving process.

FIG. 10 shows an example process flow for bonding a plurality of donor substrates to a handle substrate and subsequently cleaving the donor substrates. At step 100, each donor substrate and a handle substrate may be subjected to a low temperature plasma treatment. At step 105, each donor substrate may be arranged on the handle substrate. At step 110, each donor substrate may be bonded to the handle substrate. At step 115, a donor portion may be cleaved from each donor substrate at the separation layer, leaving a plurality of donor portions bonded to the handle substrate.

In one embodiment of the invention, bonding layer 20 of handle substrate 5 and bonding surface 90 of each donor substrate 70 may be exposed to a low temperature plasma. The low temperature plasma may activate bonding layer 20 and bonding surface 90, thereby allowing higher bond strength to be achieved at low process temperatures (e.g. room temperature).

Figure 8:
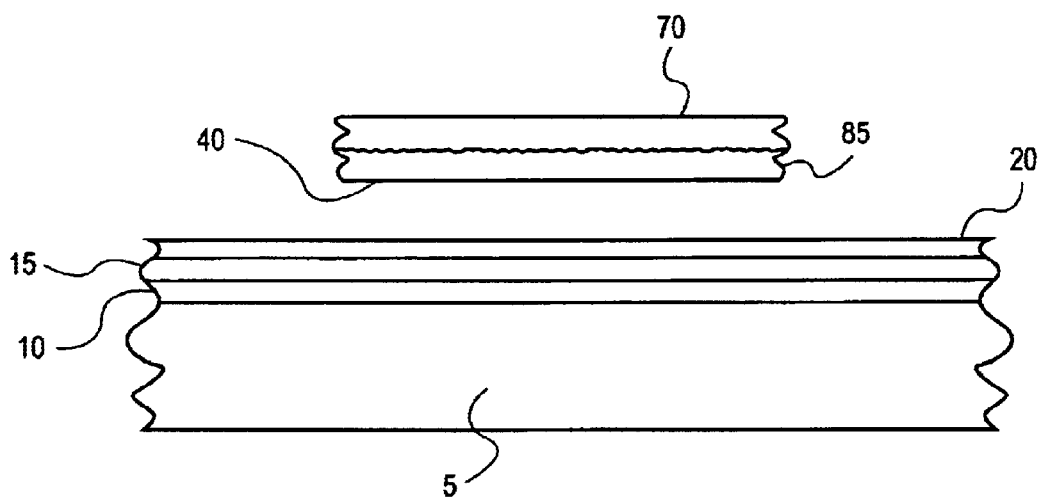
FIG. 8 is a schematic diagram illustrating an array of donor substrates arranged on a handle substrate.

Subsequent to the low temperature plasma treatment, each donor substrate 70 may be oriented such that bonding surface 90 faces bonding layer 20 of handle substrate 5, as shown in FIG. 8. The donor substrate and handle substrate stack may be compressed together to secure bonding surface 90 to bonding layer 20. Plasma activation of the bond interface helps to achieve sufficient bonding strength for a subsequent cleave process.

In an alternative embodiment, bonding layer 20 of handle substrate 5 and bonding surface 90 of each donor substrate 70 may be covered with a thin layer of amorphous silicon combined with a trace metal. Handle substrate 5 and donor substrate 70 may subsequently be heated to approximately 550° C. to activate metal induced crystallization bonding. Using this process, the amorphous silicon layer would be buried beneath a comparatively thick layer of transferred crystalline silicon. Consequently, it is unlikely the amorphous silicon layer would interfere with later TFT fabrication processes.

Figure 9:
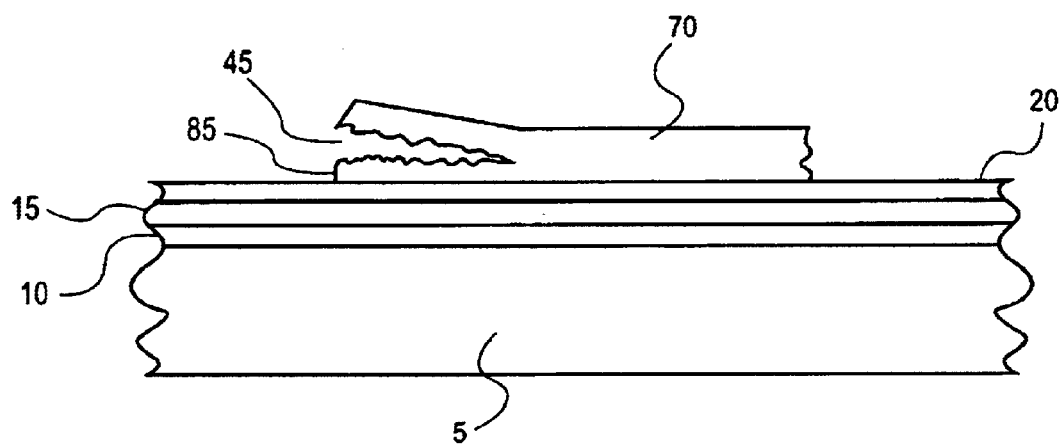
FIG. 9 is a schematic diagram illustrating a donor substrate controlled cleaving process.

Subsequent to the bonding process, donor substrate 70 may be removed from handle substrate 5. Donor substrate 70 may be removed from handle substrate 5 using, for example, a controlled cleave process. A controlled cleave process may leave a donor portion 85 of each donor substrate 70 attached to handle substrate 5. As shown in FIG. 9, donor portion 85 of donor substrate 70 is separated or cleaved from the bulk of donor substrate 70 across separation layer 80.

In one embodiment of the invention, a room temperature controlled cleave process (RT/CCP) may be used to separate donor portion 85 from donor substrate 70. An RT/CCP process may initiate a separation fracture 95 at separation layer 80 at one point on the edge of donor substrate 70 and propagate separation fracture 95 across donor substrate 70 through mechanical means. For example, separation fracture 95 may be propagated across donor substrate 70 by means of a nitrogen gas stream focused at the edge of separation layer 80. After the cleaving process, donor portion 85 of each donor substrate 70 remains bonded to handle substrate 5. Where donor substrate 70 is a mono-crystalline-silicon wafer and handle substrate 5 is a glass substrate, a silicon on glass substrate is formed.

It is to be appreciated that a wide variety of techniques and methods for forming silicon on insulator substrates have been developed by various manufacturers, such as Silicon Genesis Corporation, Canon Corporation, Ibis Corporation, and Soi-Tec Corporation. As a result, other bonding techniques may be used to bond each donor substrate 70 to handle substrate 5 and cleave donor portion 85 from donor substrate 70.

The bond and cleave process described above may be used to transfer a donor portion 85 of each donor substrate 70 to handle substrate 5. This transfer process may be used to create a silicon on glass substrate. The thickness of donor portion 85 is determined by the depth of the implant process used to generate dislocations 75 in donor wafer 70.

Donor Substrate Tiling

Figure 11:
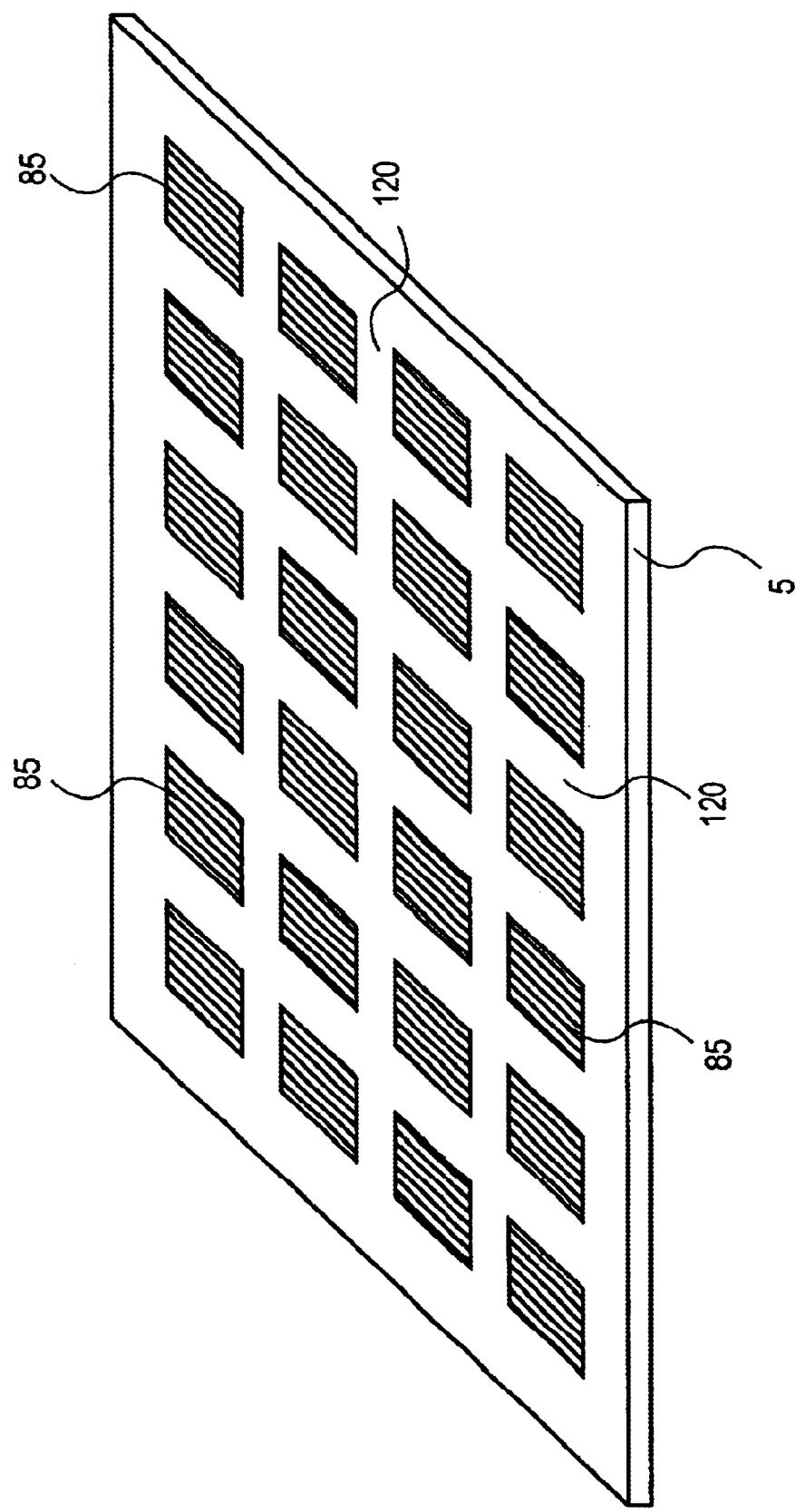
FIG. 11 is a schematic diagram illustrating an array of donor portions arranged across a handle substrate.

Referencing FIG. 11, a plurality of donor portions 85 may be positioned in an aligned array across the surface of handle substrate 5 to form a large mono-crystalline silicon or poly-silicon on glass substrate. Various patterns may be employed for "tiling" a handle substrate with a plurality of donor portions. Referencing FIG. 12A, a handle substrate may be tiled with a standard array of donor portions 85 where four donor portion corners are arranged at approximately the same location. Referencing FIG. 12B, a handle substrate may also be tiled with an offset tiling pattern of donor portions 85, where two donor portion corners and a donor portion edge are arranged at approximately the same location. An offset tiling pattern may reduce donor portion film stress at gaps 120 between adjacent donor portions 85. These tiling patterns are merely illustrative and the present invention may be readily adapted to accommodate other tiling patterns.

In order to provide uniform pixel pitch across handle substrate 5, donor portions 85 may be positioned across handle substrate 5 to a high degree of accuracy such that gaps 120 between adjacent donor portions 85 are smaller than the pixel pitch of the LCD being fabricated. For example, for an LCD with a pixel size of 0.33 mm, gaps 120 may be positioned to a tolerance of 15–20 microns in order to prevent non-uniform pixel pitch across the display. Additionally, gaps 120 between adjacent donor portions 85 may be arranged such that gaps 120 do not coincide with the locations of pixel TFTs which will subsequently be fabricated on handle substrate 5. Donor substrates 70 may, for example, be registered to optical alignment marks on the surface of handle substrate 5 in order to provide a high degree of positional accuracy. Gaps 120 between adjacent donor portions 85 may provide stress relief across the handle wafer surface, thereby providing more process latitude during subsequent process steps. Gaps 120 may typically measure approximately 25 microns or less between adjacent donor portions 85 on handle substrate 5.

Figure 12A:
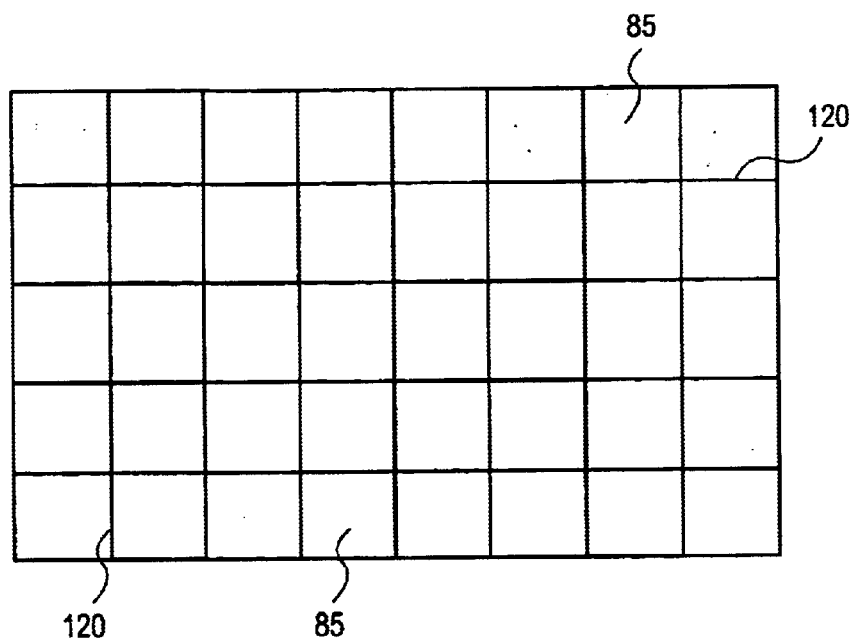
FIG. 12A is a schematic diagram illustrating a regular tiling array.
Figure 12B:
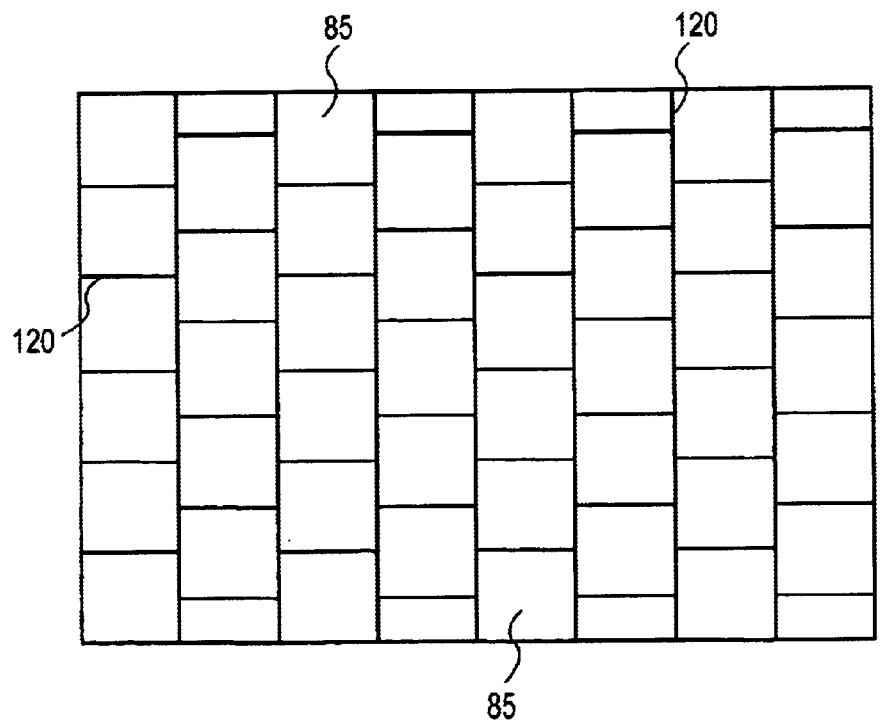
FIG. 12B is a schematic diagram illustrating an offset tiling array.

A number of tiling patterns are possible, but in all cases the objective is to minimize the gaps to 5 microns or less. FIG. 12A illustrates an ordered array pattern while FIG. 12B illustrates an offset array pattern. The purpose of the offset array pattern shown in FIG. 12B is to reduce the number of tile edges at joining points between adjoining tiles from four tile edges to three tile edges.

In one embodiment, donor portions 85 may be cleaved from 140 mm square donor substrates formed from 200 mm diameter silicon wafers or 210 mm square donor substrates formed from 300 mm diameter silicon wafers. In some embodiments, donor portions 85 may be uniform in size and shape. However, in other embodiments, donor portions 85 may be non-uniform in size and shape. For example, a poly-silicon on glass substrate required to manufacture a WS resolution 0.33 mm pitch LCD measures approximately 422 mm×338 mm. A 3×3 array of 140 mm square donor portions measures approximately 420 mm×420 mm, or approximately 82 mm longer than the required handle substrate length. Consequently, a 3×2 array of 140 mm square donor portions may be arranged adjacent to a 3×1 array of 140 mm×82 mm donor portions to cover the surface of a handle substrate measuring 422 mm×338 mm.

Tiling, Bonding, and Cleaving Process Sequencing

The tiling, bonding, and cleaving processes of the present invention may be practiced in various sequences. In one embodiment, donor substrates 70 may be individually bonded to handle substrate 5 and cleaved sequentially. For example, a first donor substrate may be bonded to handle substrate 5 and subjected to a controlled cleaving process before a second donor substrate is bonded to handle substrate 5. In another embodiment, a plurality of donor substrates 70 may be bonded to handle substrate 5 and cleaved in parallel. For example, multiple donor substrates 70 may be bonded to handle substrate 5 and then each of the bonded donor substrates 70 may be subjected to a controlled cleaving process.

In one embodiment, additional silicon may be deposited onto the surface of each donor substrate 70 subsequent to the controlled cleaving process. For example, donor substrate 70 may be planarized and a donor portion 85 of poly-silicon may be deposited onto the surface of donor substrate 70. Donor substrate 70 may be planarized by means of a chemical mechanical polishing (CMP) or etch process. A donor portion 85 of poly-silicon may be deposited onto the surface of donor substrate 70 by means of an epitaxial deposition process. Consequently, additional silicon may be continually added to each donor substrate 70 after each donor transfer process, thereby enabling the regeneration of donor portion 85 on donor substrates 70 and allowing a much longer lifetime for each donor substrate 70. Hence, the cost of donor portion 85 may be primarily dependent upon epitaxial deposition costs. Additionally, growing an epitaxial silicon film on each donor substrates 70 may allow for the precise control of n-type and p-type dopant densities. In an alternative embodiment, a silicon alloy such as silicon germanium may be grown on the surface of donor substrate 70.

Post-Cleaving Handle Substrate Processing

Additional processes may be performed on handle substrate 5, subsequent to the tiling, bonding, and controlled cleaving processes described above. Gaps 120 between adjacent donor portions 85 on handle substrate 5 may be filled with a deposited material, thereby forming a continuous donor portion layer across the surface of handle substrate 5. For example amorphous silicon or $SiO_2$ may be deposited on handle substrate 5 to fill gaps 120 between adjacent donor portions 85. Subsequent to filling gaps 120, handle substrate 5 may be subjected to a planarization process to smoothen the donor portion layer of handle substrate 5. For example, a chemical mechanical polishing (CMP) process or an $H_2$/HCl etch process may be performed on handle substrate 5 to smoothen the donor portion layer. In one embodiment, handle substrate 5 may be annealed to re-crystallize the bonded and deposited silicon layers. Additional processes may subsequently be performed on handle substrate 5 to form electronic devices.

The present invention may be used to form a monocrystalline silicon or poly-silicon film across the surface of a large glass substrate. Thin film transistors (TFTs) may be subsequently formed on the crystalline silicon film for use in large area electronic applications, such as active-matrix liquid crystal displays.

Processing System

Figure 14:
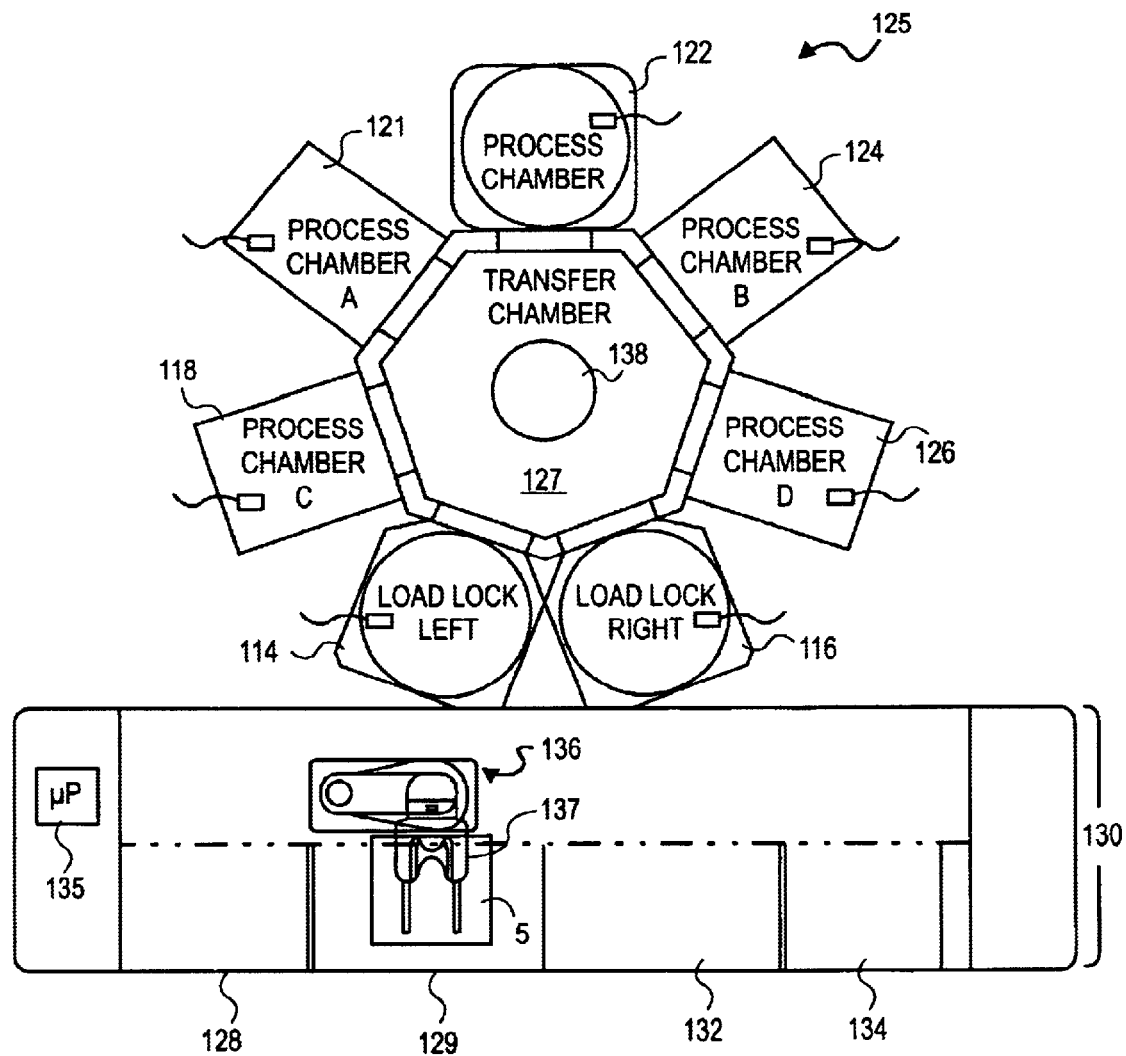
FIG. 14 is a schematic top view of a substrate manufacturing system.

FIG. 14 is a schematic top view of a manufacturing system 125 in which the method of the present invention may be practiced. Manufacturing system 125 may be, for example, an AKT 1600, 4300, or 5500 manufacturing system manufactured by Applied Materials Incorporated of Santa Clara, Calif. that incorporates a cleaving apparatus as described herein.

Referencing FIG. 14, manufacturing system 125 for forming a poly-silicon layer on handle substrate 5 may include atmospheric cassette load station 130; two load-lock chambers 114, 116; process chambers 118, 121, 122, 124 and 126; and a transfer chamber 127. Process chambers 118, 121, 122, 124 and 126 may comprise tiling/bonding chambers, physical vapor deposition (PVD) chambers, chemical vapor deposition (CVD) chambers, etch chambers, and/or pre-heat chambers. Load-lock chamber 114 may be adapted to hold handle substrates 5 and load-lock chamber 116 may be adapted to hold donor substrates 70. Atmospheric cassette load station 130 may include an atmospheric transfer arm 136 and substrate cassettes 128, 129, 132, and 134 which contain processed and unprocessed substrates. Substrate cassettes 128 and 129 may be adapted to hold handle substrates 5 and substrate cassettes 132 and 134 may be adapted to hold donor substrates 70. Transfer chamber 127 may include a vacuum transfer arm 138 for transferring handle substrates 5 and donor substrates 70 into and out of load-lock chambers 114 and 116, as well as processing chambers 18–26. Other chambers, such as a cool down chamber, may be attached to transfer chamber 127 as required.

Figure 15:
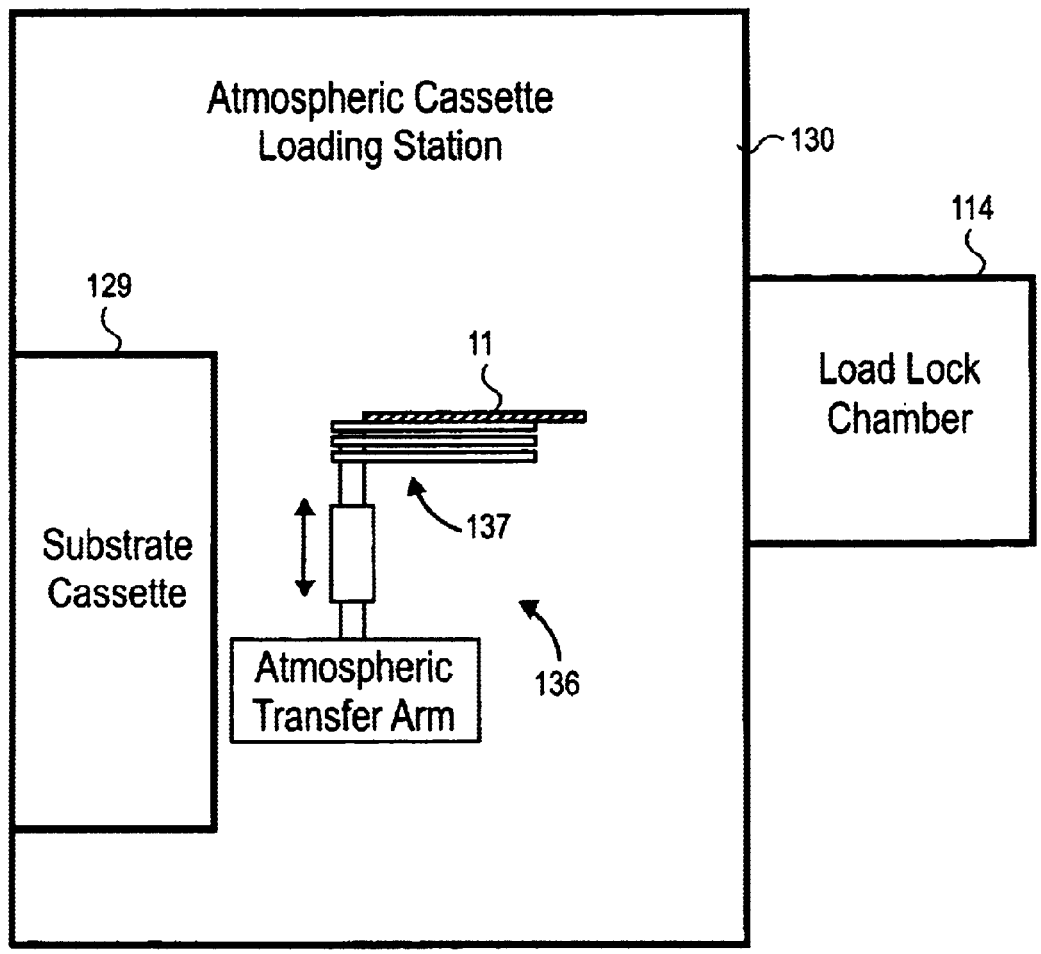
FIG. 15 is a schematic front view of the loading chamber shown in FIG. 14.

In operation, cassette load station 130 is at atmospheric pressure and each of the process chambers 118, 121, 122, 124 and 126 is maintained at sub-atmospheric pressure. Load-lock chambers 114, 116 are at atmospheric pressure when a substrate is transferred to or from cassette load station 130, and load-lock chambers 114, 116 are at sub-atmospheric pressure when a substrate is transferred to or from transfer chamber 127. Atmospheric transfer arm 136 may slide back and forth transversely along a linear track inside cassette load station 130. Atmospheric transfer arm 136 may include a transfer head 137 with three arm segments which may be rotated about three pivot axes to controllably position a handle substrate 5 or donor substrate 70 in load-lock chambers 114, 116 with a high degree of accuracy. Transfer head 137 may also move vertically up and down, as indicated by the double-headed arrow shown in FIG. 15. The position and orientation of atmospheric transfer arm 136 may be recorded and controlled by a microprocessor-based controller 135.

Referencing FIG. 16, in one embodiment which may be used in an LCD fabrication process, a handle substrate 5 and donor substrates 70 may be processed in manufacturing system 125 as follows. At step 140, atmospheric transfer arm 136 may transfer handle substrate 5 from cassette load station 130 to load-lock chamber 114. At step 141, load-lock chamber 114 may be evacuated to a pressure of about $10^{-5}$ Torr. At step 142, vacuum transfer arm 138 may remove handle substrate 5 from load-lock chamber 114 and transfer handle substrate 5 through transfer chamber 127 to tiling/bonding chamber 122, which may be pumped down to a pressure of approximately $10^{-7}$–$10^{-8}$ Torr. At step 144, handle substrate 5 may be subjected to a low temperature plasma treatment process that prepares bonding layer 20 for a subsequent bonding process.

At step 150, atmospheric transfer arm 136 may transfer a donor substrate 70 from cassette load station 130 to load-lock chamber 116. At step 151, load-lock chamber 116 may be evacuated to a pressure of about $10^{-5}$ Torr. At step 152, vacuum transfer arm 138 may remove donor substrate 70 from load-lock chamber 116 and transfer donor substrate 70 through transfer chamber 127 to process chamber 121. At step 154, donor substrate 70 may be subjected to a low temperature plasma treatment process that prepares bonding surface 90 of donor substrate 70 for a subsequent bonding process. At step 155, vacuum transfer arm 138 may remove donor substrate 70 from process chamber 121 and transfer donor substrate 70 through transfer chamber 127 to tiling/bonding chamber 122.

Tiling/bonding chamber 122 may have a heated pedestal to receive a handle substrate 5 and donor substrates 70. Vacuum transfer arm 138 may position donor substrates 70 on handle substrate 5 in tiling/bonding chamber 122 in a previously defined array pattern, such as the array patterns shown in FIGS. 12A and 12B. Tiling/bonding chamber 122 may include an imaging and alignment metrology system to guide vacuum transfer arm 138 in positioning donor substrates 70 on handle substrate 5, thereby minimizing gaps 120 between adjacent donor portions 85. In one embodiment, donor substrates 70 may be registered to optical alignment marks on the surface of handle substrate 5. Vacuum transfer arm 138 may be structured to apply a force to donor substrates 70 so as to generate pressure between bonding surface 90 of donor substrate 70 against the surface of handle substrate 5.

Tiling/bonding chamber 122 may be maintained within a range of temperatures and pressures beneficial to forming a bond between handle substrate 5 and donor substrates 70. In one embodiment, tiling/bonding chamber 122 may be maintained at a temperature such that handle substrate 5 and donor substrates 70 are at a temperature of approximately 350–450° C. during processing. In this embodiment, tiling/bonding chamber 122 may be maintained at a process pressure between 10–760 Torr during the bonding process.

In one embodiment, tiling/bonding chamber 122 may have a moveable nozzle for separating or cleaving donor portion 85 of donor substrates 70, thereby leaving donor portion 85 bonded to handle substrate 5. For example, tiling/bonding chamber 122 may have a moveable nitrogen nozzle which may be focused at separation layer 80 on the edge of donor substrate 70. In an alternative embodiment, process chamber 118, 124, or 126 may have a moveable nozzle and handle substrate 5 may be transferred to one of process chambers 118, 124, or 126 subsequent to the bonding process, where a donor portion 85 may be cleaved from donor substrate 70.

Figure 16:
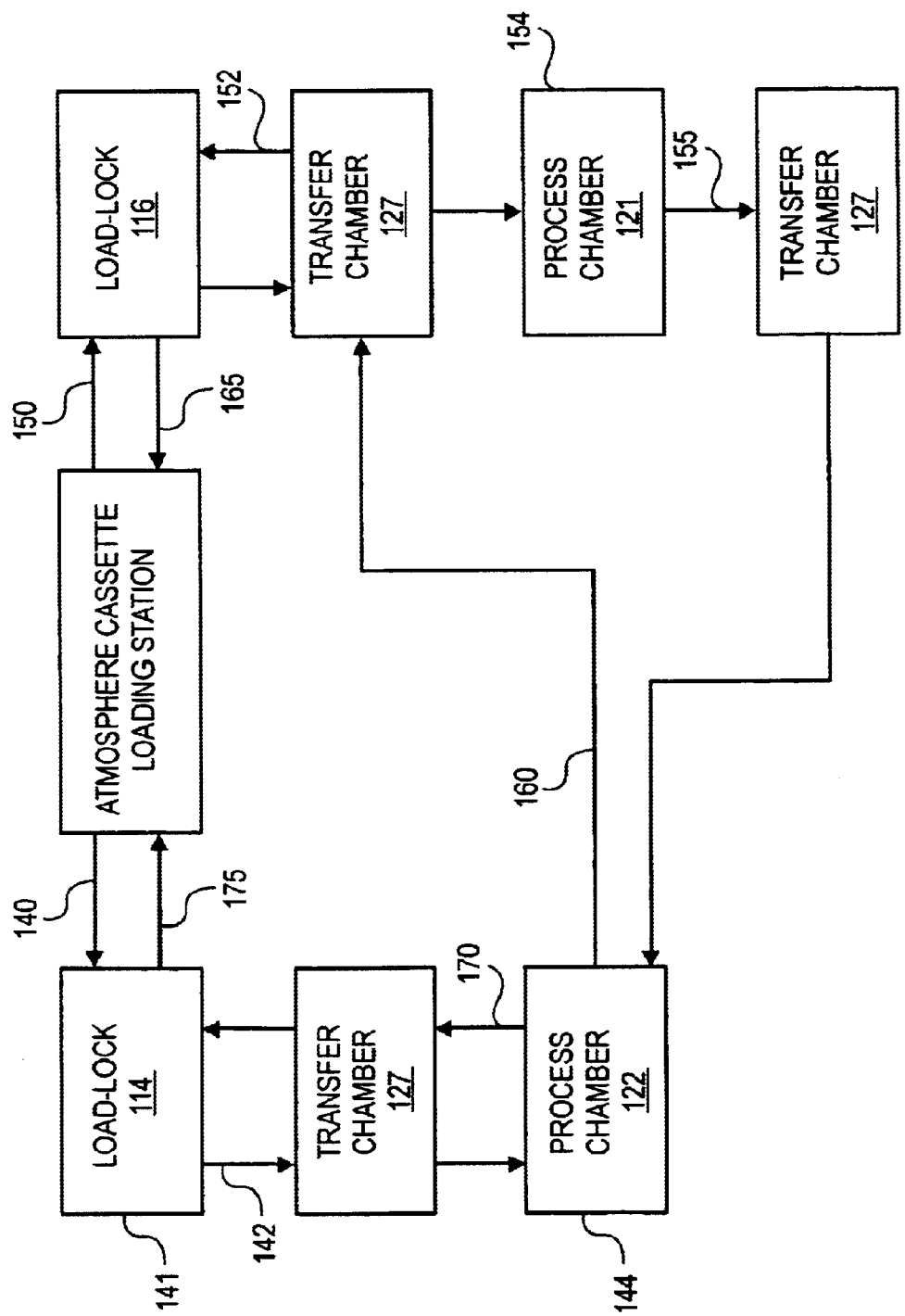
FIG. 16 is a block diagram illustrating handle substrate and donor substrate movement through the manufacturing system of FIG. 14.

Referencing FIG. 16, subsequent to the controlled cleave process, vacuum transfer arm 138 may transfer donor substrates 70 from tiling/bonding chamber 122 back to load-lock chamber 116 through transfer chamber 127 at step 160. At step 165, load-lock chamber 116 may be vented to atmospheric pressure and atmospheric transfer arm 136 may transfer donor substrates 70 from load-lock chamber 116 to cassette load station 130. In one embodiment, additional silicon may subsequently be deposited onto the surface of donor substrates 70. For example, donor substrates 70 may be smoothened by chemical mechanical polishing (CMP) and an epitaxial silicon layer may be deposited onto the surface of donor substrates 70. Donor substrates 70 may then be subjected to an implant process for forming separation layer 80 and returned to cassette load station 130 for processing additional handle substrates 5.

After an array of donor portions 85 have been bonded to the surface of handle substrate 5 by means of the bonding and controlled cleave process described above, vacuum transfer arm 138 may transfer handle substrate 5 to one of process chambers 118, 124, or 126 from tiling/bonding chamber 122 for additional processing. In one embodiment, amorphous silicon may be deposited to fill gaps 120 between adjacent donor portions 85. In another embodiment, $SiO_2$ may be deposited to fill gaps 120 between adjacent donor portions 85. Subsequent to filling gaps 120, handle substrate 5 may be transferred to another one of process chambers 118, 124, or 126 for performing an etch process, thereby etching deposited gap filling materials from the surface of donor portions 85 bonded to handle substrate 5. Handle substrate 5 may also be transferred to another one of process chamber 118, 124, or 126 and heated to a temperature of approximately 350–550° C. to anneal and re-crystallize the bonded and deposited silicon layers.

After handle substrate 5 has completed all processing steps within manufacturing system 125, vacuum transfer arm 138 may transfer handle substrate 5 back to load-lock chamber 114 through transfer chamber 127 at step 165. At step 170, load-lock chamber 114 may be vented to atmospheric pressure and atmospheric transfer arm 136 may transfer handle substrate 5 from load-lock chamber 114 to cassette load station 130.

Handle substrate 5 may then be removed from manufacturing system 125 for additional processing. For example, handle substrate 5 may be planarized using a chemical mechanical polishing process, thereby removing deposited gap filling materials from the surface of donor portions 85 bonded to handle substrate 5. TFTs may be subsequently formed on the handle substrate poly-silicon surface for use in large area electronic applications, such as active-matrix liquid crystal displays. The use of poly-silicon TFTs may allow for circuit performance approaching 30–60% that of crystalline silicon devices, with n-type and p-type silicon electron mobilities of at least 500 and 300, respectively.

The present invention facilitates the manufacture of large area flat-panel video displays. The tiling methods described herein are scaleable and can make use of future advances in active-matrix LCD technology and manufacturing methodologies.

We claim:

1. A method for applying a film across the surface of a handle substrate, the method comprising:
   providing a plurality of donor substrates;
   forming a separation layer within each donor substrate;
   arranging the donor substrates across a surface of a handle substrate;
   bonding the donor substrates to the handle substrate surface;
   cleaving the donor substrates at their respective separation layers; and
   removing the donor substrates from the handle substrate, thereby leaving a donor portion of each donor substrate attached to the handle substrate surface.

2. The method of claim 1 wherein the handle substrate comprises a glass substrate.

3. The method of claim 1 wherein each donor substrate comprises a mono-crystalline silicon wafer.

4. The method of claim 3 wherein each donor substrate comprises a poly-silicon layer formed on a mono-crystalline silicon wafer.

5. The method of claim 1 wherein the separation layer is formed by an ion implant process.

6. The method of claim 5 wherein the ion implant process implants hydrogen ions within each donor substrate.

7. The method of claim 6 wherein the hydrogen ions are implanted at a depth of 100–500 nm.

8. The method of claim 1 wherein die donor portion of each donor substrate bonded to the handle substrate is approximately 100–500 nm thick.

9. The method of claim 1, wherein each donor substrate is doped to a level between 1E15–1B18 atoms/$cm^3$.

10. The method of claim 1, further comprising depositing amorphous silicon in gaps between adjacent donor portions.

11. The method of claim 10, further comprising planarizing the handle substrate surface to remove deposited amorphous silicon from the donor portions.

12. The method of claim 1, further comprising depositing silicon-oxide in gaps between adjacent donor portions.

13. The method of claim 12, further comprising planarizing the handle substrate surface to remove deposited silicon-oxide from the donor portions.

* * * * *